United States Patent [19]

Jeng

[11] Patent Number: 5,858,871
[45] Date of Patent: *Jan. 12, 1999

[54] POROUS INSULATOR FOR LINE-TO-LINE CAPACITANCE REDUCTION

[75] Inventor: Shin-Puu Jeng, Plano, Tex.

[73] Assignee: Texas Instruments Incorporated, Dallas, Tex.

[ * ] Notice: The term of this patent shall not extend beyond the expiration date of Pat. No. 5,527,737.

[21] Appl. No.: 662,557

[22] Filed: Jun. 13, 1996

Related U.S. Application Data

[63] Continuation of Ser. No. 448,069, May 23, 1995, abandoned, which is a continuation-in-part of Ser. No. 250,137, May 27, 1994, Pat. No. 5,527,737.

[51] Int. Cl.$^6$ .................................................... H01L 21/44
[52] U.S. Cl. ......................... 438/623; 438/624; 438/781
[58] Field of Search .................................... 437/195, 228, 437/231, 235; 438/623, 624, 781; 148/DIG. 133

[56] References Cited

U.S. PATENT DOCUMENTS

| | | | |
|---|---|---|---|
| 5,003,062 | 3/1991 | Yen | 437/231 |
| 5,043,789 | 8/1991 | Linde et al. | |
| 5,106,787 | 4/1992 | Yen | 437/231 |
| 5,119,170 | 6/1992 | Iwamatsu | |
| 5,223,804 | 6/1993 | Usui | |
| 5,250,472 | 10/1993 | Chen et al. | 437/231 |
| 5,312,512 | 5/1994 | Allman et al. | 156/636.1 |
| 5,371,046 | 12/1994 | Liaw et al. | 437/231 |
| 5,432,128 | 7/1995 | Tsu | 437/194 |
| 5,441,915 | 8/1995 | Lee | 437/195 |
| 5,527,737 | 6/1996 | Jeng | 437/195 |
| 5,548,159 | 8/1996 | Jeng | |

Primary Examiner—Caridad Everhart
Attorney, Agent, or Firm—W. James Brady, III; Richard L. Donaldson

[57] ABSTRACT

An interconnect structure and method is described herein. First, interconnect lines 14a–d are formed on a semiconductor body 10. Then, a dielectric layer 20 is coated over the semiconductor body and the interconnect lines 14a–d to a thickness sufficient to more than fill the gaps between adjacent interconnect lines. The dielectric layer 20 is baked and then cured at a elevated temperature greater than the baking temperature. By using baking, then curing, the dielectric layer 20 inside the gaps has a lower density than that above interconnect lines and that in open fields. The removal of dielectric layer from the top of the interconnect lines by etchback is optional. Finally, a layer of silicon dioxide 12 is deposited over the interconnect lines 14a–d and the dielectric layer 20. In one embodiment, contact vias 11 are then etched through the silicon dioxide 12 and dielectric layer 20 to the interconnect lines 14a–c. Preferably, the dielectric material is spun on. One advantage of the invention is providing a metallization scheme that reduces line-to-line capacitance. A further advantage of the invention is providing a metallization scheme that reduces crosstalk and power dissipation. A further advantage of the invention is providing a dielectric layer between interconnect lines having a lower density and a lower dielectric constant than dense silicon dioxide.

21 Claims, 6 Drawing Sheets

POROUS INSULATOR FOR LINE-TO-LINE CAPACITANCE REDUCTION

This application is a Continuation of application Ser. No. 08/448,069, filed May 23, 1995, now abandoned, which is a continuation-in-part of application Ser. No. 08/250,137, filed on May 27, 1994, entitled "Selective Formation of Low-Density, Low-Dielectric-Constant Insulators in Narrow Gaps for Line-to-Line Capacitance Reduction," now U.S. Pat. No. 5,527,737.

CROSS-REFERENCE TO RELATED APPLICATIONS

The following coassigned patent applications are hereby incorporated herein by reference:

| Ser. No. | Filing Date | TI Case No. |
| --- | --- | --- |
| 08/247,195 | 05/20/94 | TI-18941 |
| 08/246,432 | 05/20/94 | TI-19072 |

The following coassigned patent applications filed concurrently herewith the patent application for the present invention, are also incorporated herein by reference:

| Ser. No. | TI Case No. | Inventor | Title |
| --- | --- | --- | --- |
| 08/250,747 | TI-19179 | Gnade, et al. | Low Dielectric Constant Layers via Immiscible Sol-Gel Processing |
| 08/250,063 | TI-19305 | Havemann, et al. | Multilevel Interconnect Structure with Air Gaps Formed Between Metal Leads |

FIELD OF THE INVENTION

This invention relates to semiconductor processing and more specifically to reducing line-to-line capacitance in semiconductor devices.

BACKGROUND OF THE INVENTION

Semiconductors are widely used in integrated circuits for electronic applications, including high speed computers and wireless communications. Such integrated circuits typically use multiple transistors fabricated in single crystal silicon. Many integrated circuits now contain multiple levels of metallization for interconnections. A single semiconductor microchip may have thousands, and even millions of transistors. Logically, a single microchip may also have millions of lines interconnecting the transistors. As device geometries shrink and functional density increases, it becomes imperative to reduce the capacitance between the lines. Line-to-line capacitance can build up to a point where a delay time and crosstalk may hinder device performance. Reducing the capacitance within these multi-level metallization systems will reduce the RC constant, crosstalk voltage, and power dissipation between the lines. The material typically used to isolate metal lines from each other is silicon dioxide. Silicon dioxide is a thermally and chemically stable material. Conventional oxide etches are also available for high-aspect-ratio contacts and vias.

However, the dielectric constant of dense silicon oxide grown by thermal oxidation or chemical vapor deposition is on the order of 3.9. The dielectric constant is based on a scale where 1.0 represents the dielectric constant of a vacuum. As used herein, the term "low dielectric" will refer to a material with a dielectric constant less than 3.7.

Recently, attempts have been made to use low-density materials, such as aerogel, having a lower dielectric constant to replace dense silicon oxide. The dielectric constant of a porous silicon dioxide, such as aerogel, can be as low as 1.2. This lower dielectric constant results in a reduction in the RC delay time. However, the traditional method of making aerogel requires a supercritical drying step, which increases the cost and the degree of complexity for semiconductor manufacturing.

SUMMARY OF THE INVENTION

The present invention is a novel method of selectively forming a low-density, low-dielectric constant insulator between metal lines, which reduces the line-to-line capacitance. In addition, the present invention does not require a supercritical drying step, and can be easily adopted to any standard production process.

An interconnect structure and method is described herein. First, a plurality of interconnect lines are formed on a semiconductor body. Then, a dielectric material layer is coated over the semiconductor body and the plurality of interconnect lines to a thickness sufficient to more than fill the gaps between adjacent interconnect lines. The low dielectric material is baked and then cured at an elevated temperature above the baking temperature. By using baking, then curing, the dielectric material inside the gaps has a lower density than that above interconnect lines and that in open fields. The removal of low dielectric material from the top of the interconnect lines by etchback is optional. Finally, a layer of silicon dioxide is deposited over the interconnect lines and the low dielectric material.

The density difference between the gaps and the open fields can be further increased by a leaching etch, which etches the more porous material in the gaps faster than the less porous material in the open fields.

In one embodiment, contact vias are then etched through the silicon dioxide and low dielectric material layer to the plurality of interconnect lines. Preferably, the low dielectric material is a spin-on dielectric material.

One advantage of the invention is providing a metallization scheme that reduces line-to-line capacitance.

A further advantage of the invention is providing a metallization scheme that reduces crosstalk and power dissipation.

A further advantage of the invention is providing a dielectric layer between interconnect lines having a lower dielectric constant than dense silicon dioxide.

BRIEF DESCRIPTION OF THE DRAWINGS

This invention can be best understood by reference to the following drawing(s), in which.

Corresponding numerals and symbols in the different figures refer to corresponding parts unless otherwise indicated.

DESCRIPTION OF THE PREFERRED EMBODIMENTS

Figure 1:
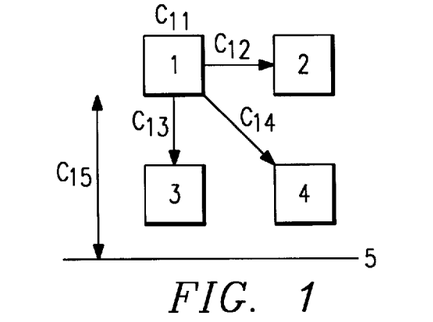
FIG. 1 is a block diagram of a multilevel interconnect device.

FIG. 1 illustrates a vertical sectional view through a device having a ground plane 5 disposed substantially parallel to metal interconnect lines 1, 2, 3, and 4. Electrical signals carried by these interconnect lines 1, 2, 3, and 4 each are affected by the RC time constant of that particular line. In the case of line 1, the capacitance element of the RC time constant is broken into four components. The first capacitance component is capacitance $C_{12}$ which is the line-to-line capacitance between line 1 and line 2. The second component is $C_{13}$ which is the interlayer capacitance between line 1 and the line below it, line 3. The third component is $C_{14}$ which is the interlayer layer capacitance between line 1 and the line diagonally below line 1, line 4. The fourth component is $C_{15}$, which is the line to ground capacitance between line 1 and ground 5. $C_{11}$ is defined as the total capacitance. The metal width of each of lines 1–4 is about 0.36 $\mu$m. The line-to-line spacing is also about 0.36 $\mu$m. The height of metal lines 1–4 is about 0.6 $\mu$m. The oxide thickness between metal lines is about 0.7 $\mu$m. Capacitance simulation was completed on the structure of FIG. 1 and the results are shown in Tables 1 and 2.

TABLE 1

| Solution for bias | |
| --- | --- |
| V1 | 1.0000000E + 00 |
| V2 | 0.0000000E + 00 |
| V3 | 0.0000000E + 00 |
| V4 | 0.0000000E + 00 |
| V5 | 0.0000000E + 00 |

TABLE 2

| Previous Solution Used as Initial Guess | | | | | |
| --- | --- | --- | --- | --- | --- |
| Norm XR Electrode # | P-iter 1 Voltage (Volts) | c-iter  Flux (Coul/mic.) | v-error 0.0000E + 00 I(Electron) (A/micron) | n-error  I(Hole) (A/micron) | p-error  I(Total) (A/micron) |
| $C_{11}$ | 1.0000E + 00 | 1.0842E − 16 | 0.0000E + 00 | 0.0000E + 00 | 0.0000E + 00 |
| $C_{12}$ | 0.0000E + 00 | −9.1582E − 17 | 0.0000E + 00 | 0.0000E + 00 | 0.0000E + 00 |
| $C_{13}$ | 0.0000E + 00 | −1.0418E − 17 | 0.0000E + 00 | 0.0000E + 00 | 0.0000E + 00 |
| $C_{14}$ | 0.0000E + 00 | −6.4178E − 18 | 0.0000E + 00 | 0.0000E + 00 | 0.0000E + 00 |
| $C_{15}$ | 0.0000E + 00 | −5.5909E − 21 | 0.0000E + 00 | 0.0000E + 00 | 0.0000E + 00 |

As can be seen from the c-iter column of Table 2, the line-to-line capacitance accounts for 85% of the total capacitance in the above example. Of course the percent will vary depending on the line-to-line spacing. As the spacing decreases, the percentage of total capacitance increases. Accordingly, reducing the line-to-line capacitance of closely spaced interconnect lines will have a significant effect on the total RC delay time of a given interconnect line. Although, the invention will be described in conjunction with a multi-level metallization process, it will be apparent to those skilled in the art that the number of metallization levels may vary and that the invention is equally applicable to single level metal devices.

Figure 2:
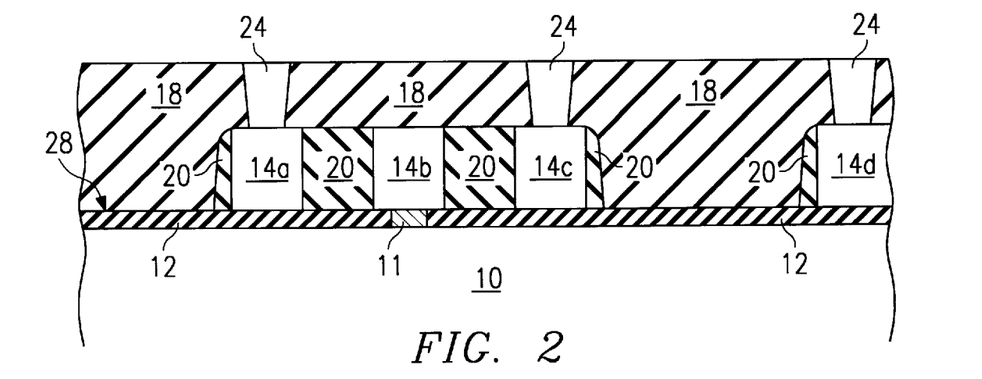
FIG. 2 is a vertical cross sectional view of an interconnect structure according to the invention.

FIG. 2 shows an interconnect level on a semiconductor body 10, according to the invention. The semiconductor body 10 may contain transistors, diodes, and other semiconductor elements (not shown) as are well known in the art. Semiconductor body 10 may also contain other metal interconnect layers. Insulator layer 12 is formed on the surface of semiconductor body to isolate the structures of semiconductor body from interconnect lines 14a–d. Insulator layer 12 may be comprised of an oxide such as silicon dioxide. Contacts, such as contact 11, extend through insulator 12 to connect interconnect lines 14a–c to semiconductor body 10. Interconnect lines 14a–d may be made of electrically conducting material such as aluminum or titanium-nitride/aluminum/titanium-nitride multilayers although other conductive material may also be employed. Interconnect lines 14a–c are closely spaced (e.g., less than 0.5 micron), but interconnect lines 14c and 14d have a much wider spacing (e.g., >2.0 micron) between them. Layer 20 comprises low-density, low-dielectric constant material and isolates interconnect lines 14a–c from each other. Low-density, low-dielectric-constant layer 20 may be comprised of porous silicon dioxide, porous siloxane, porous silsesquioxane or other porous, low-density material having a dielectric constant of less than 3.7. Porous silicon dioxide is used in the preferred embodiment.

The low dielectric constant material of layer 20 is placed in areas of the device that have the maximum impact on capacitance. Because the line-to-line capacitance on closely spaced interconnect lines is the most significant contributor to the total capacitance, low-density and low-dielectric-constant material such as porous silicon dioxide is placed between interconnect lines 14a–c. Dense silicon oxide 18 is used elsewhere (e.g., between interconnect lines 14c and 14d) and to isolate interconnect 14a–d from subsequent formed elements such as additional interconnect layers (not shown). Contact vias, such as those illustrated at 24 extend through silicon dioxide layer 18 to provide interconnect at desired locations with interconnect lines 14a–d.

There are several advantages to having a porous silicon dioxide in between interconnect lines. First, because the low dielectric constant material 20 has a dielectric constant lower than dense silicon dioxide, the line-to-line capacitance is reduced. Second, conventional oxide etches are available for high-aspect-ratio contacts and vias. Third, the surrounding dense silicon dioxide provides a barrier against mechanical instability of porous material. Fourth, the surface of silicon dioxide is planarized for lithographic patterning. Fifth, because the interfacial force between the porous material and the sidewalls of the interconnect lines stabilizes the porous structure. In addition, the porous material in between the interconnect lines is structurally stable up to a temperature as high as 700° C. The high thermal stability not only allows the use of porous material for interlayer dielectric (ILD) application, but also for poly-metal dielectric (PMD) application.

Figure 3:
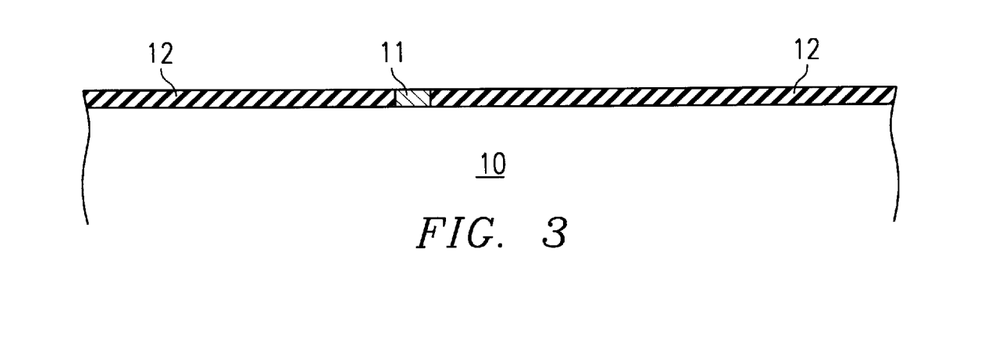
FIGS. 3–4 are vertical cross-sectional diagrams showing sequential stages of fabrication of the structure of FIG. 2.

FIG. 3 shows a semiconductor body 10 after the formation of transistors and other device elements (not shown). One or more interconnect layers may have also been formed in semiconductor body 10. Insulator layer 12 and contact 11 are formed on the surface of semiconductor body 10.

Figure 4:
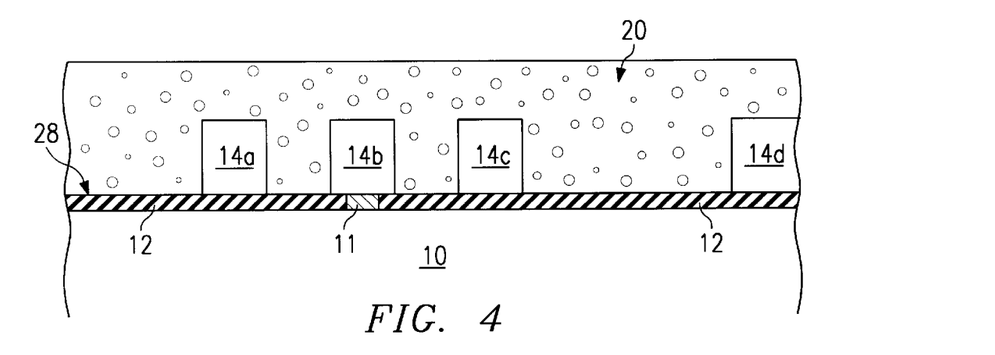

Referring to FIG. 4, a metal layer is deposited and etched to form interconnect lines 14a–d. For simplicity, FIG. 4 shows only the four interconnect lines 14a–d. However, it will be apparent to those skilled in the art that many other interconnect lines as well as other geometries may also form the interconnect lines. Interconnect lines 14a–d have a vertical thickness on the order of 0.5–2.0 micron and a horizonal thickness which varies by design, but will typically be in the range of 0.25 to 1 micron. After the formation of interconnect lines 14a–d, a thin layer of silicon dioxide (not shown) may optionally be deposited over the surface of the structure. However, since this layer of silicon dioxide is optional, it will not be shown in the drawings.

Still referring to FIG. 4, a layer of dielectric material 20 is deposited over the surface of the structure to a thickness on the order of 0.2–5.0 micron. Layer 20 is deposited to a thickness sufficient to fill the areas between interconnect lines 14a–c. Layer 20 may be comprised of spin-on colloid suspension materials such as polysilsesquioxane, siloxane, or silicate.

Figure 5:
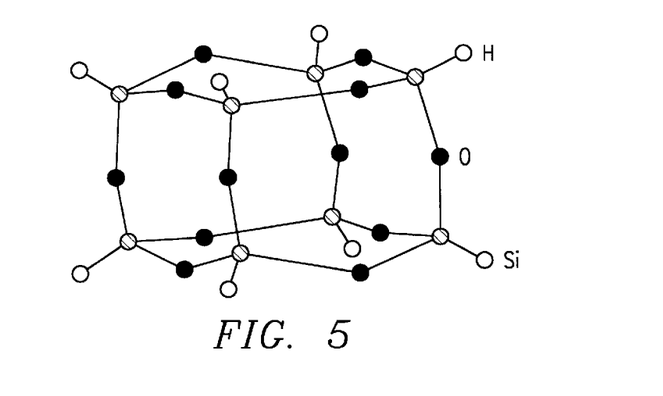
FIG. 5 is a depiction of the molecular structure of polyhedral silsesquioxane, $H_8Si_8H_{12}$.

In addition, layer 20 may be comprised of vapor deposited gel-like materials, such as highly hydrolyzed silicon dioxide. Even though, Dow Corning™ Polysilsesquioxane Flowable Oxide® (hereinafter referred to as "flowable oxide") is used in the preferred embodiment, other hydrogen silsesquioxanes (HSQ) could be used. HSQs have a general formula $(HSiO_{1.5})_{2n}$, where n=3 to 8. The nomenclature of silsesquioxane indicates that each silicon atom is connected to 1.5 oxygen atoms. The molecular structure of polyhedral silsesquioxane, $H_8Si_8O_{12}$ is shown in FIG. 5.

Figure 6:
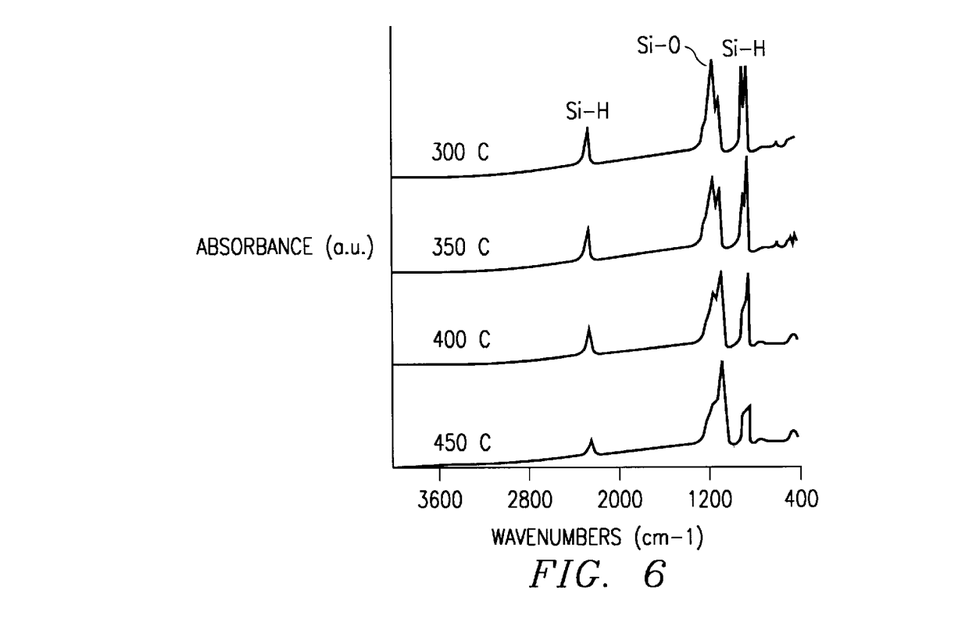
FIG. 6 is a Fourier Transformation Infra-Red (FTIR) spectrascopy of hydrogen silsesquioxanes (HSQ) as a function of cure temperature.

The FTIR spectra graph of HSQ are shown in FIG. 6. The graph depicts how different cure temperatures relate to the infrared absorbance (a.u.) and the wavenumbers (cm−1).

The changes in both Si—H and Si—O infrared absorption peaks suggest that HSQ molecules reconfigure themselves as cure temperature increases. X-ray diffraction indicates formation of an amorphous films at all temperatures investigated. HSQ exhibits excellent gapfill and planarization capability, partially because the starting material has a relatively low glass transition temperature (~250 degrees Celsius).

Figure 7:
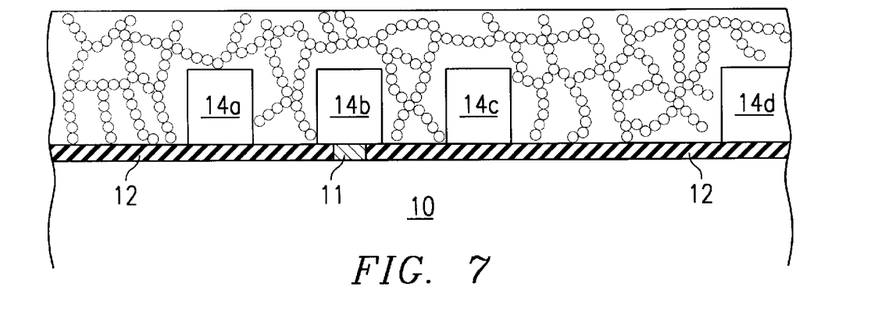
FIGS. 7–8 are vertical cross-sectional diagrams showing sequential stages of fabrication of the structure of FIG. 2.

Now referring to FIG. 7, the structure from FIG. 4 is baked after deposition. Typical baking temperature is between 150° C. and 300° C. Baking removes residual solvent from the dielectric material layer 20, and causes crosslinking between initially suspended particles. Additionally, pores are created in network because of the evaporation of solvent.

Figure 8:
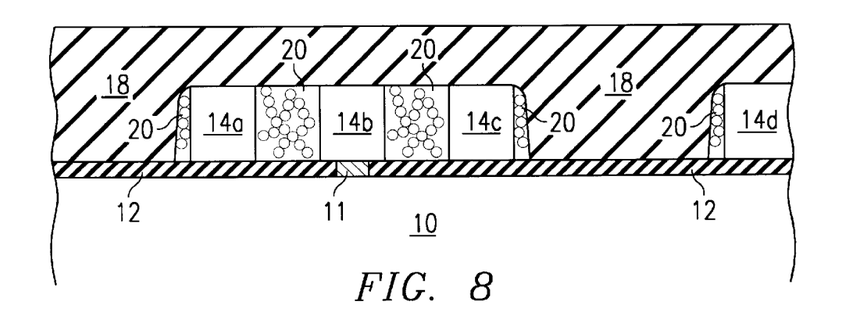

In FIG. 8, the structure is cured at a temperature higher than the initial bake temperature. For interlayer dielectric application, typical curing temperature is between 300° C. and 500° C. For poly-metal dielectric application, higher curing temperature (e.g., >500° C.) may be needed. Curing densifies dielectric material 20 between interconnect lines 14c–d, and in open field areas. However, the material between lines 14a–c is not densified, and remains to be porous. This is probably because the interaction between the network and the sidewalls of interconnect lines prevents densification. Since porous silicon dioxide tends to absorb moisture, the material may require a cap of moisture resistant material (e.g. plasma oxide).

Figure 9:
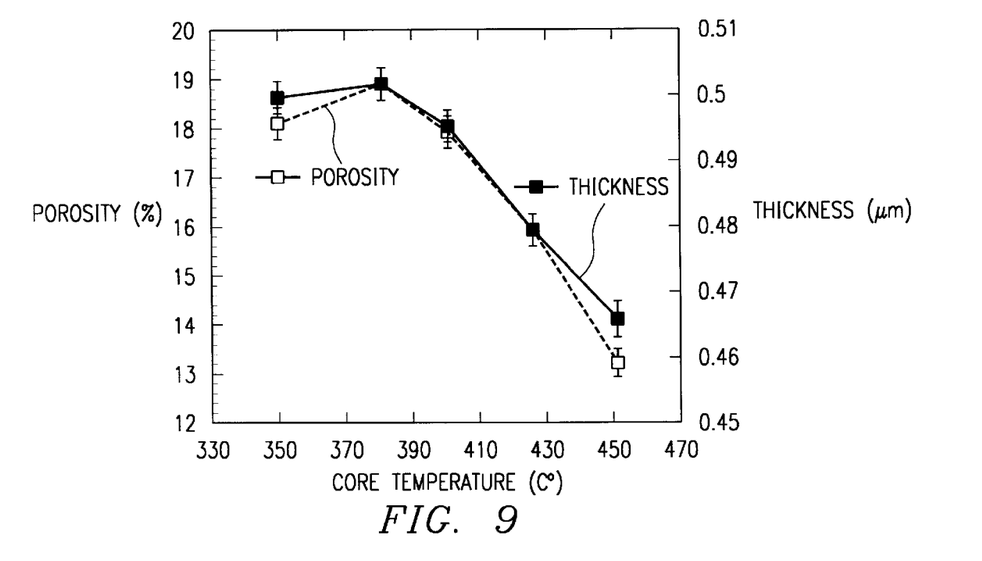
FIG. 9 is a graph of the thickness and porosity of condensed HSQ on a flat silicon wafer as functions of cure temperature.

Porosity develops during crosslinking of HSQ. FIG. 9 shows the measured thickness and porosity of condensed films on flat Si wafers as a function of cure temperature. Both thickness and porosity decreased with increasing cure temperature due to densification. The porosity was ~19% for films cured below 400 degrees Celsius, and decreased to ~13% for the film cured 450 degrees Celsius.

Figure 10:
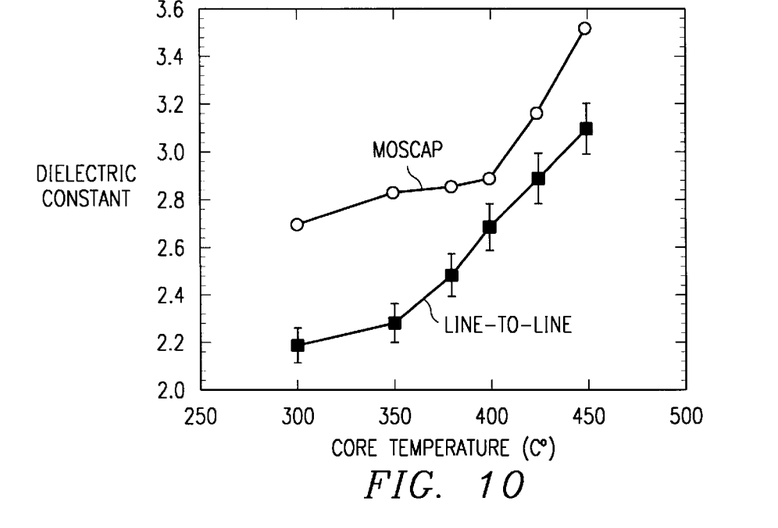
FIG. 10 is a graph of Metal Oxide Semiconductor Capacitance (MOSCAP) and line-to-line dielectric constant of HSQ as function of cure temperature.

The corresponding dielectric constants measured by the MOSCAP method are shown in FIG. 10. (The values are referenced to thermal oxide (k=3.96). Line-to-line capacitance measurements were carried out using a 0.50/0.50 µm width/spacing comb structure.) When cure temperature decreased from 450 degrees Celsius to 300 degrees Celsius, the dielectric constant reduced from ~3.5 to ~2.7, indicating that the pores inside HSQ film lowered the effective dielectric constant. The line-to-line capacitance was carefully measured using comb structures, and the extracted dielectric constants are also shown in FIG. 10. Similar to the MOSCAP data, the line-to-line dielectric constant decreased with decreasing cure temperature, however it was substantially smaller than the MOSCAP dielectric constant for a given cure temperature, suggesting that the density of HSQ film gaps was lower than that on an open field. However, since the HSQ may have less mechanical strength than dense silicon dioxide, dense silicon dioxide may be used in the open field areas, while porous silicon dioxide remains between interconnect lines. Furthermore, the top silicon dioxide layer and metal interconnect sidewalls could provide a barrier (confinement) for the porous silicon dioxide.

Figure 11:
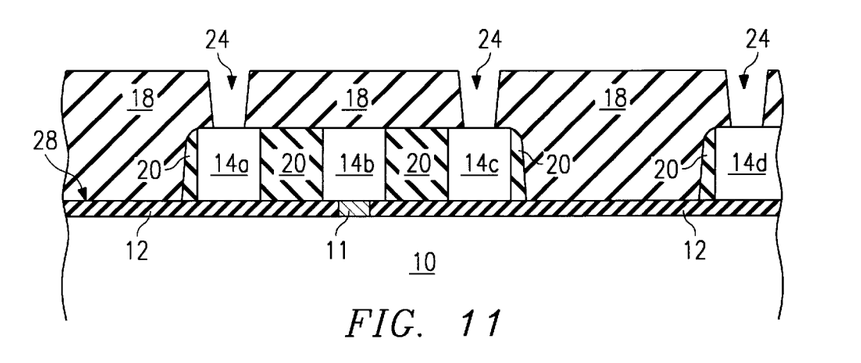
FIGS. 11–12 are vertical cross-sectional diagrams showing sequential stages of fabrication of the structure of FIG. 2.

Now referring to FIG. 11, contact vias 24 are patterned and etched through silicon dioxide layer 18 to interconnect lines 14 according to conventional techniques. One advantage of the invention is that conventional contact/via etches may be used while achieving a shorter RC delay time. This is due to the fact that dense silicon dioxide layer 18 remains where vias are desired, but low-density, porous silicon dioxide is used in the space between adjacent interconnect lines which has the effect of reducing the RC time constant for the lines. Finally, a metal layer is deposited and etched to fill vias 24, resulting in the structure of FIG. 2.

Figure 12:
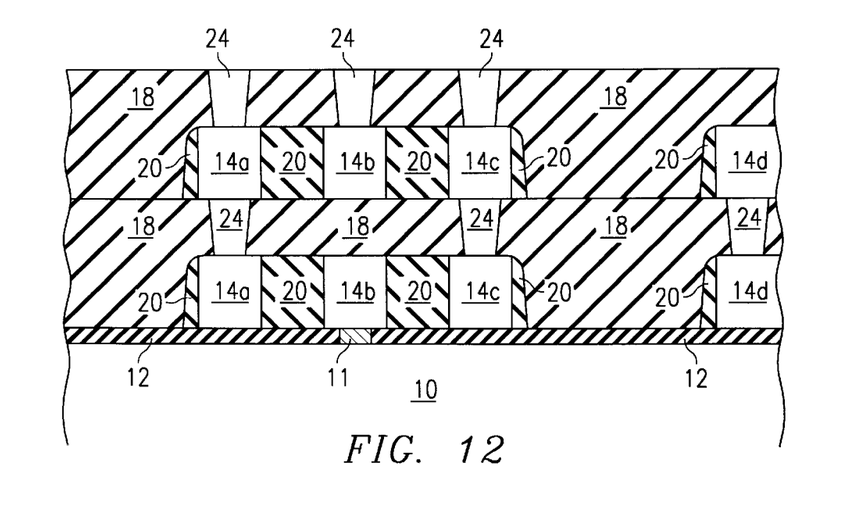

After formation of the structure of FIG. 2, the process may be repeated to form additional metal interconnect layers, as shown in FIG. 12. Typically, three of four such metal interconnect layers may be formed. However, the invention is equally applicable to devices having only single or double metal interconnects as well as those having more than four levels of interconnect lines.

Figure 13:
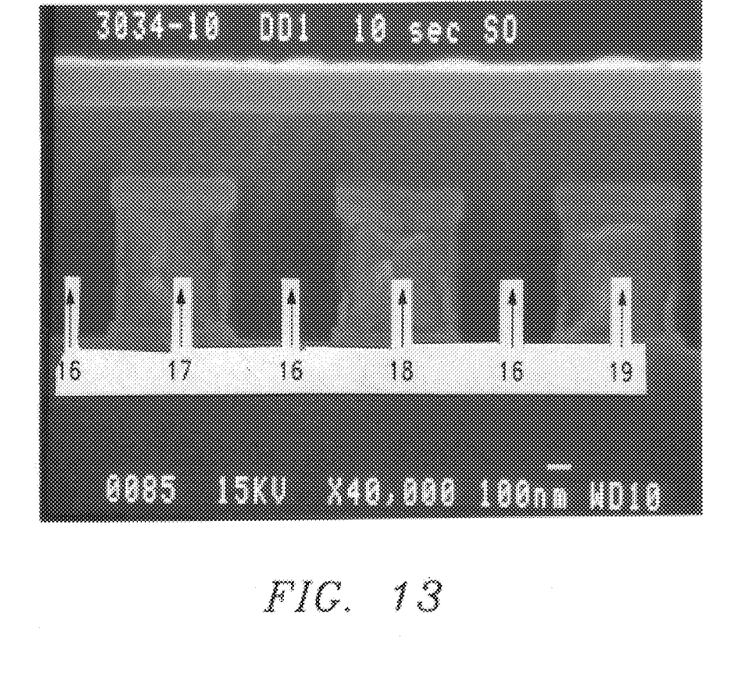
FIGS. 13–14 are micrographs of a cross-sections of a semiconductor device.

Referring to FIG. 13, flowable oxide 16 is cured at 400° C. for one hour. The flowable oxide 16 is etched away in 10 seconds by a standard staining solution (a mixture of $NH_4F$ and acetic). The flowable oxide 16 between the lines 17–19 is less dense, and therefore has a higher etch rate than the flowable oxide in open field areas. The material is estimated to contain at least 20% porosity, which reduces the dielectric constant of silicon dioxide to less than 3.3.

Figure 14:
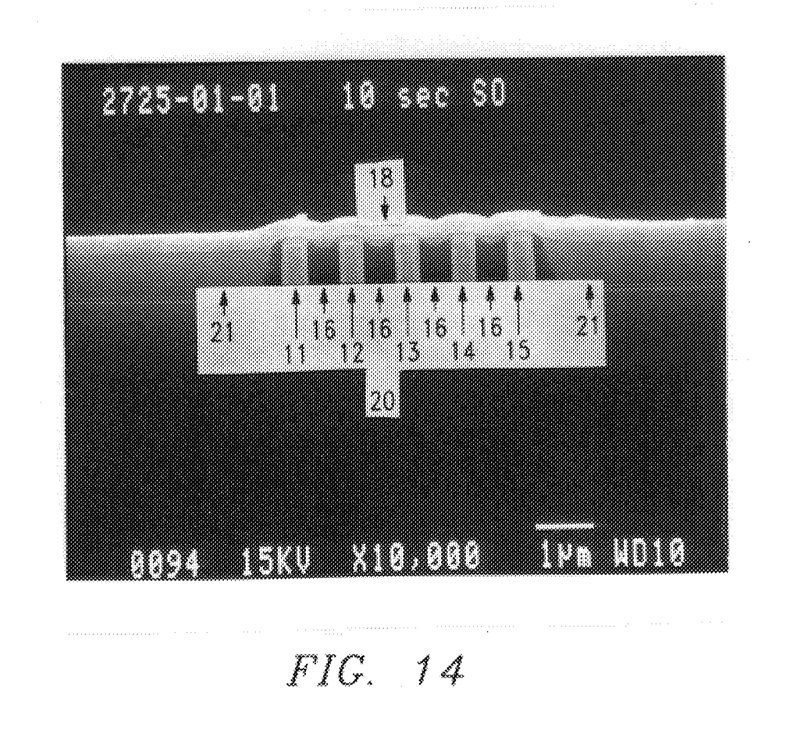

Referring to FIG. 14, while the flowable oxide 16 is cured at a higher temperature 700° C., again the flowable oxide 16 between lines 11–15 is less dense than the oxide in open field areas 21. The oxide 16 is etched away in 14 seconds in standard staining solution. However, the material cured at a higher temperature is less porous. The porosity is estimated to be about 10% in flowable oxide 16. FIG. 14 also depicts a protective cap layer 18 and the a lower layer of material 20.

Figure 15:
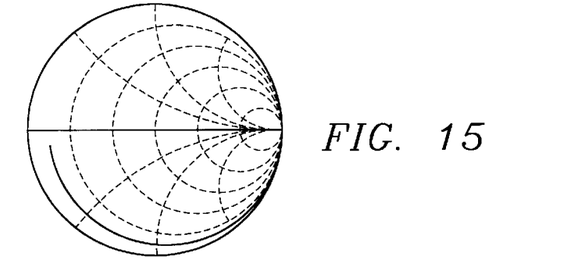
FIG. 15 is a polar plot of the reflection coefficient (Smith chart) from a comb structure.
Figure 16:
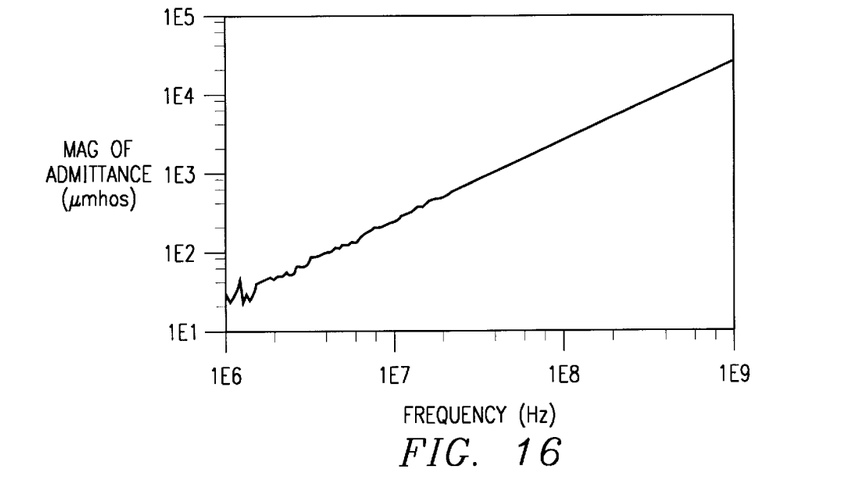
FIG. 16 is a graph depicting extracted admittance (after de-embedding of pads) as a function of frequency.

In addition, FIGS. 15 and 16 show the high frequency response up to 1 GHz of this new porous interlayer dielectric (300 degrees Celsius cured). FIG. 15 is a polar plot of the reflection coefficient (Smith chart) from a comb structure, showing that the structure behaved as a nearly ideal capacitor with a very small metal series resistance. FIG. 16 shows the extracted admittance (after de-embedding of pads) as a function of frequency. The slope of admittance is the capacitance of the structure, which was constant from 1 MHz to 1 GHz, indicating that no absorption of reaction of the dielectric occurred in the range.

Another method to further reduce the dielectric constant of HSQ spin-on glass is using a resin with a lower molecular weight. The lower molecular weight material has more hydrogen ligand, and forms a less dense film. The material with a higher molecular weight has less hydrogen ligand and is denser because the cage structure often collapses. The lower molecular weight HSQ has more hydrogen attached to the cube, and therefore the resultant film has a higher porosity as depicted in FIG. 16. The current HSQ product of Dow Corning™ has an average molecular weight of 10000 amu.

Figure 17:
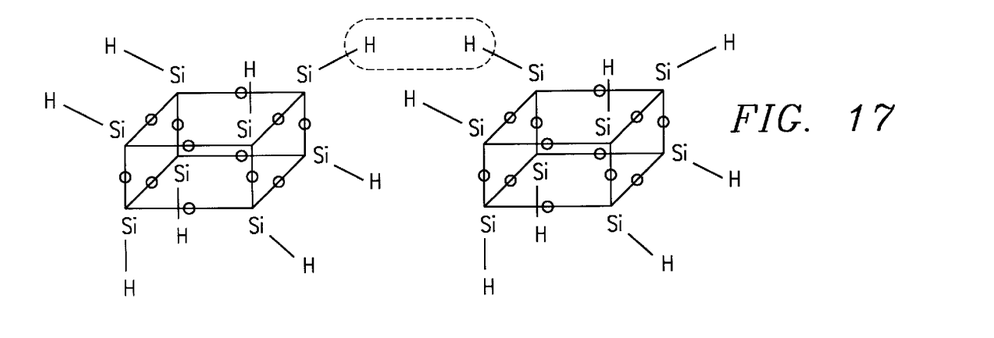
FIG. 17 is a representation of the chemical structure of HSQ.
Figure 18:
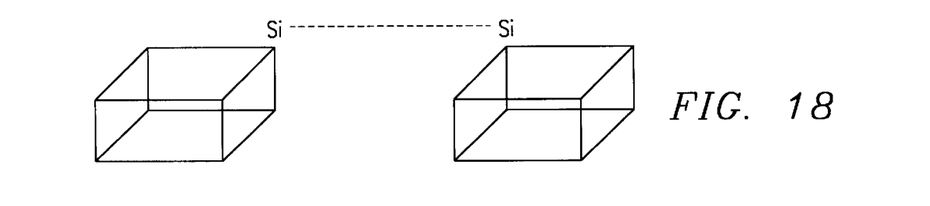
FIG. 18 is a repesentation of one possible chemical bond situation of HSQ.

The loss of the hydrogen ligand could result in a direct Si—Si bond as shown in FIG. 17 or a collapse of the cage structure. Either result would reduce the porosity of the final film.

While the preferred embodiment was described with definite porosity percentages, methods exist to change the porosity of low dielectric material. It is to be understood that various modifications to the process of producing the low dielectric material and its varying porosity is encompassed in the invention. For example, cross referenced application TI-19072 describes various methods to vary the porosity of low dielectric material. For instance, variation in curing temperature, PH value, viscosity (changed by diluted low dielectric material), and ambient atmosphere (e.g. vacuum, $N_2$, oxygen) can modify the porosity of the low dielectric material.

In addition, the density difference between the gaps and the open fields can be further increased by a leaching etch, which etches the more porous material in the gaps faster than the less porous material in the open fields. For example, the leaching etch could be accomplished by making a hole in the material and injecting gaseous HF into the hole to increase the porosity. Furthermore, other methods to increase the porosity in the dielectric material between the gaps are discussed in cross-referenced applications TI-19179 and TI-19305.

While this invention has been described with reference to illustrative embodiments, this description is not intended to be constructed in a limiting sense. Various modifications and combinations of the illustrative embodiments, as well as other embodiments of the inventions, will be apparent to persons skilled in the art upon reference to the description. It is therefore intended that the appended claims encompass any such modifications or embodiments.

What is claimed is:

1. A method of making an interconnect layer in a semiconductor device with a reduction in line-to-line capacitance, comprising:

forming semiconductor elements on a semiconductor body;

coating a dielectric layer over the semiconductor body and said semiconductor elements;

baking said dielectric layer; and curing said dielectric layer at an elevated temperature to form a dielectric between closely spaced semiconductor elements which is less dense than said dielectric between relatively farther spaced semiconductor elements.

2. The method of claim 1, wherein said curing further includes curing said dielectric layer to produce a dielectric between said closely spaced semiconductor elements with a dielectric constant of less than 3.7.

3. The method of claim 2, wherein said curing includes curing in a furnace at a temperature in a range of 200° C. to 700° C.

4. The method of claim 1, wherein said method further includes depositing an oxide liner by plasma deposition over said semiconductor elements and below said dielectric layer.

5. The method of claim 1, wherein said baking is by a hot plate at a temperature in a range from room temperature to 500° C.

6. The method of claim 2, wherein said curing is at a temperature is less than 400° C.

7. The method of claim 1, wherein said method further includes removing said dielectric layer over said plurality of semiconductor elements and in open areas in said semiconductor body.

8. A method of making an interconnect layer in a semiconductor device with a reduction in line-to-line capacitance, comprising:

forming interconnect lines on a semiconductor body with a first and a second of said lines being spaced at less than one and one-half line width and with a third line being spaced from said second line by at least three line widths;

coating a dielectric layer over said semiconductor body and said plurality of interconnect lines; and baking said dielectric layer.

9. The method of claim 8, wherein said method further includes curing said dielectric layer at an elevated temperature to form a dielectric between said first and second lines which is less dense than said dielectric between said second and third line and in which said dielectric between said first and said second lines has a dielectric constant of less than 3.7.

10. The method of claim 9, wherein said curing includes curing in a furnace at a temperture in a range of 200° C. to 700° C.

11. The method of claim 8, wherein said method further includes etching said dielectric layer to decrease the density of the dielectric between said first and second lines.

12. The method of claim 8, wherein said forming a dielectric layer includes spinning on said dielectric layer.

13. The method of claim 8, wherein said method further includes removing said dielectric layer over said plurality of interconnect lines and in open areas in said semiconductor body.

14. The method of claim 8, wherein said method further includes forming a silicon dioxide layer over said plurality of interconnect lines and said dielectric layer.

15. The method of claim 14, wherein said method further includes forming contact vias through said silicon dioxide layer and dielectric layer to the plurality of interconnect lines.

16. The method of claim 8, wherein said baling is at a temperature in the range from room temperature to 500° C.

17. The method of claim 9, wherein said curing is at a temperature less than 400° C.

18. The method of claim 8, wherein said method includes forming a moisture resistant cap material above said dielectric layer.

19. A method of making an interconnect layer in a semiconductor device with a reduction in line-to-line capacitance, comprising:

forming semiconductor elements on a semiconductor body;

depositing an oxide liner by plasma deposition over said semiconductor elements;

spin-coating a dielectric layer over said oxide liner;

baking said dielectric layer by a hot plate at a temperature in a range from room temperature to 500° C.;

curing said dielectric layer at an elevated temperature to form a dielectric between closely spaced semiconductor elements which is less dense than said dielectric between relatively farther spaced semiconductor elements; and forming a moisture resistant cap material above said dielectric layer.

20. The method of claim 19, wherein said curing further includes curing said dielectric layer to produce a dielectric between said closely spaced semiconductor elements has a dielectric constant of less than 3.7.

21. The method of claim 20, wherein said curing includes curing in a furnace at a temperture in a range of 200° C. to 700° C.

* * * * *